(12) United States Patent
Aurongzeb et al.

(10) Patent No.: US 11,315,989 B2
(45) Date of Patent: Apr. 26, 2022

(54) SYSTEM AND METHOD FOR DYNAMIC PRIVACY SCREEN ON AN OLED DISPLAY

(71) Applicant: DELL PRODUCTS, LP, Round Rock, TX (US)

(72) Inventors: Deeder Aurongzeb, Austin, TX (US); Jongseo Lee, Austin, TX (US); Asim Siddiqui, Cedar Park, TX (US)

(73) Assignee: Dell Products L.P., Round Rock, TX (US)

(\*) Notice: Subject to any disclaimer, the term of this patent is extended or adjusted under 35 U.S.C. 154(b) by 29 days.

(21) Appl. No.: 17/039,459

(22) Filed: Sep. 30, 2020

(65) Prior Publication Data

US 2022/0102445 A1 Mar. 31, 2022

(51) Int. Cl.
*H01L 27/32* (2006.01)
*H01L 51/52* (2006.01)

(52) U.S. Cl.
CPC ...... *H01L 27/3232* (2013.01); *H01L 51/5281* (2013.01); *H01L 2251/306* (2013.01); *H01L 2251/308* (2013.01)

(58) Field of Classification Search
CPC .......................... H01L 27/3232; H01L 51/5281
See application file for complete search history.

(56) References Cited

U.S. PATENT DOCUMENTS 10,605,422 B2 3/2020 Kastner-Jung et al.
2007/0090751 A1\* 4/2007 Cok ....................... H01L 27/322
313/501

FOREIGN PATENT DOCUMENTS

EP 1 396 676 B1 8/2018

\* cited by examiner

*Primary Examiner* — Daniel P Shook
(74) *Attorney, Agent, or Firm* — Larson Newman, LLP

(57) ABSTRACT

An organic light emitting diode (OLED) display includes an OLED panel and an electroconductive (EC) filter. The OLED panel provides an image. The EC filter permits the image to be viewed within a first viewing angle in response to a first voltage applied to the EC filter, and permits the image to be viewed exclusively within a second viewing angle in response to a second voltage applied to the EC filter.

20 Claims, 6 Drawing Sheets

SYSTEM AND METHOD FOR DYNAMIC PRIVACY SCREEN ON AN OLED DISPLAY

FIELD OF THE DISCLOSURE

This disclosure generally relates to information handling systems, and more particularly relates to a dynamic privacy screen on an OLED display.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An Organic Light Emitting Diode (OLED) display may include an OLED panel that provides an image. An EC filter may permit the image to be viewed within a first viewing angle in response to a first voltage applied to the EC filter, and may permit the image to be viewed exclusively within a second viewing angle in response to a second voltage applied to the EC filter.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
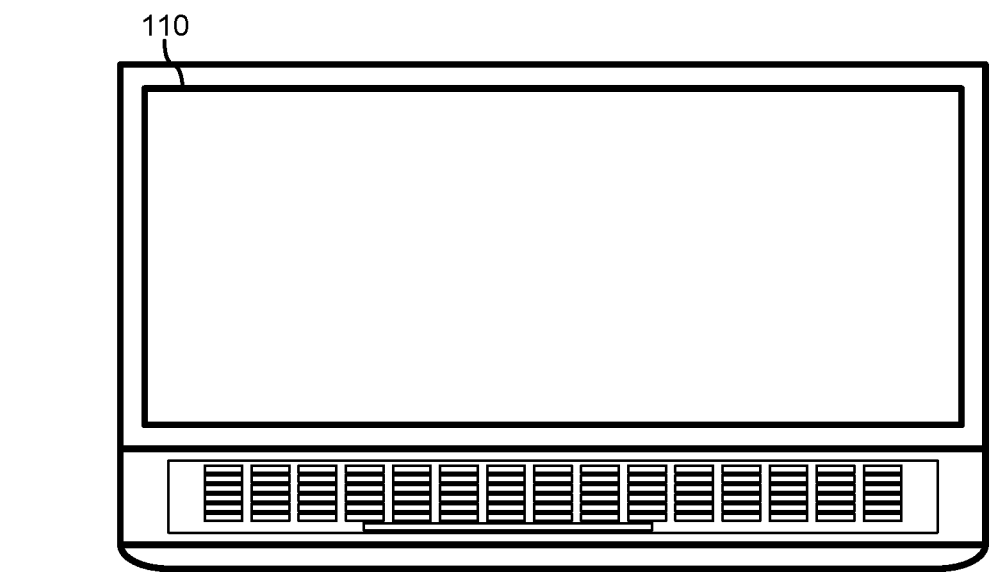
FIG. 1 is a diagram of an organic light emitting diode (OLED) display according to the prior art.
Figure 1:
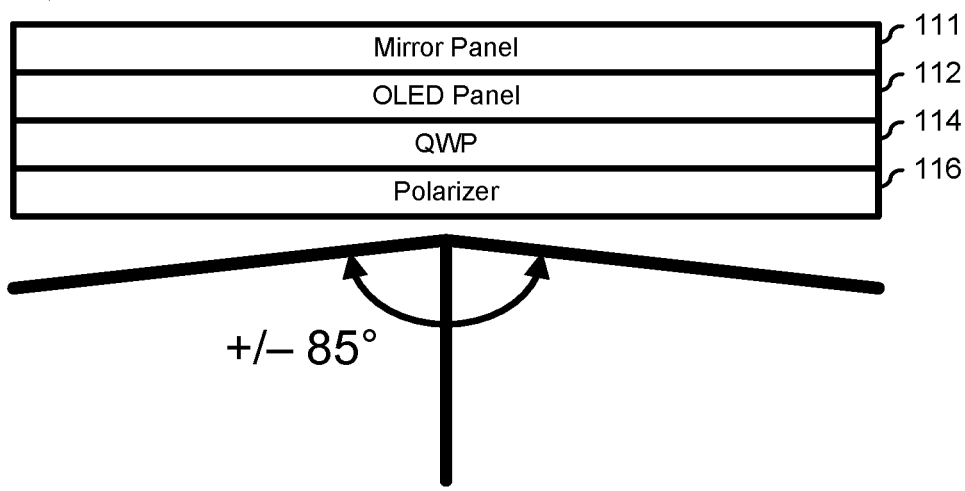

FIG. 1 illustrates an information handling system 100 according to the prior art. Information handling system 100 includes an Organic Light Emitting Diode (OLED) display 110. Information handing system 100 is illustrated as a laptop computer system, but this is not necessarily so, and the information handling system represents any of a variety of systems types that utilize OLED displays, where privacy of the content displayed on the OLED display is a concern. As such, information handling system 100 may represent a smart device, such as a tablet device, a smart phone device, a monitor, a television, or the like. OLED display 110 includes an OLED panel 112, a quarter-wave plate (QWP) 114, and a polarizer 116. OLED panel 112 represents the array of pixel elements which compose the image displayed on OLED display 110. An example of OLED panel 112 includes a passive-matrix OLED (PMOLED) panel, an active-matrix OLED (AMOLED) panel, or another type of OLED panel, as needed or desired. The details related to OLED displays, and the generation of images thereon, is known in the art, and will not be further described herein, except as needed to illustrate the current embodiments.

It is known in the art that OLED panels may utilize a mirrored back panel to increase the brightness of the image on an OLED display. However, such a mirrored back panel may lead to unwanted reflections from the ambient environment being present in the image. For this reason, OLED display 110 includes mirrored back panel 111, QWP 114 and polarizer 116. Here, ambient light passes through polarizer 116 and is linearly polarized. Upon passing through QWP 114, the linearly polarized ambient light is circularly polarized in either a right-handed polarization or a left-handed polarization. Then, upon being reflected from the mirrored back panel, the ambient light's handedness is inverted. The opposite-handed reflected light passes through QWP in the opposite direction, and is reverted to linearly polarized light that is orthogonal to the originally polarized ambient light, and thus the reflection is cancelled. The combination of QWP 114 and polarizer 116 is sometime referred to as a circular polarizer. OLED display 110 is shown a having a wide viewing angle. In particular, OLED technology is a Lambertian light emitter, emitting equal amounts of light in each direction. Thus OLED display 110 has a practical viewing angle of up to +/−85 degrees. It will be understood that OLED display 110 may include one or more additional layers, coatings, deposits, films, or the like, between OLED panel 112, QWP 114, and polarizer 116, and on the surface of the polarizer, as needed or desired. The details of manufacturing OLED panels is known in the art, and will not be further described herein, except as needed to illustrate the current embodiments.

Figure 2:
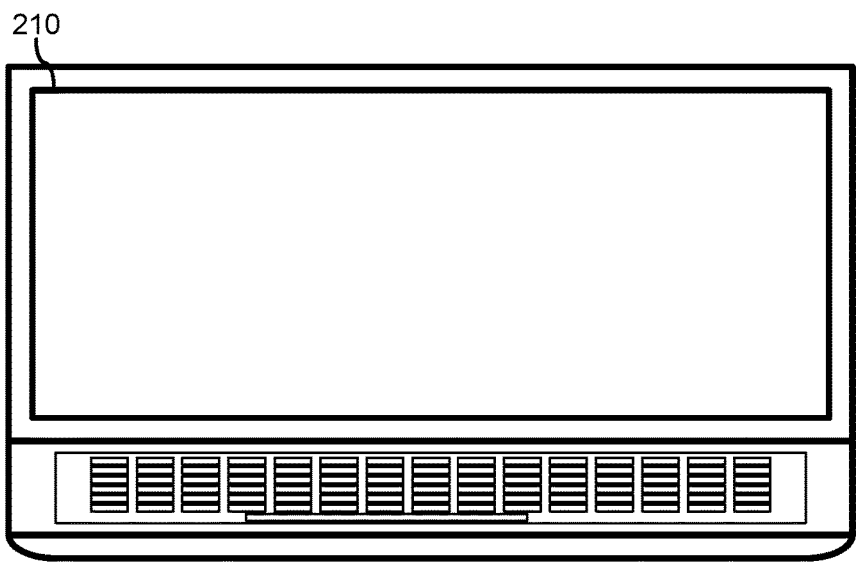
FIG. 2 is a diagram of an OLED display according to an embodiment of the current disclosure.
Figure 2:
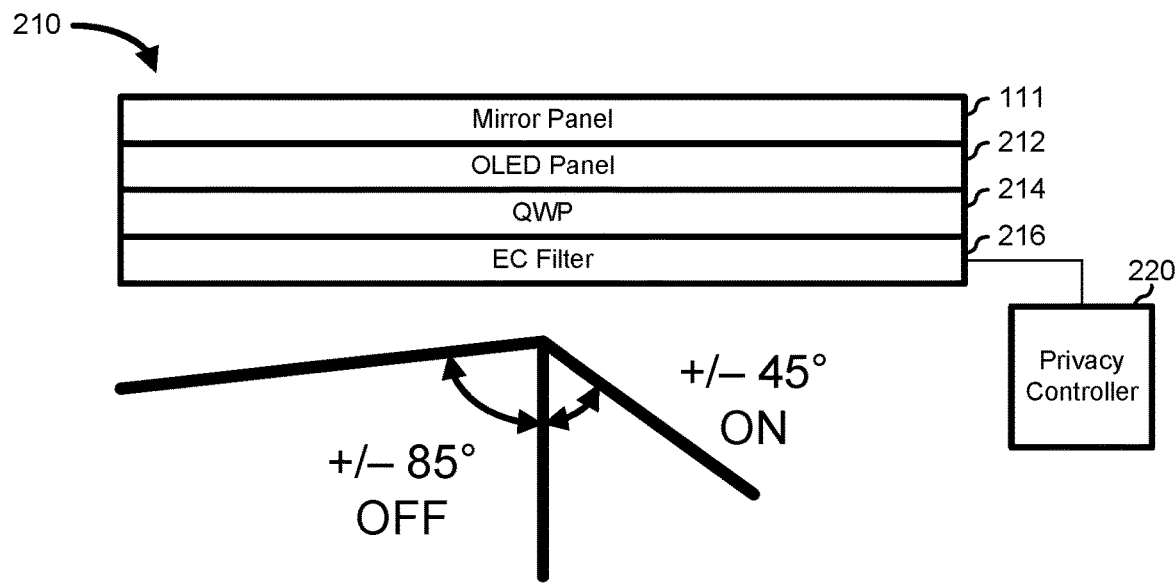

FIG. 2 illustrates an embodiment of an information handling system 200, including an OLED display 210 and a privacy controller 220. Information handing system 200 is similar to information handling system 100, and represents any of a variety of systems types that utilize OLED displays, where privacy of the content displayed on the OLED display is a concern. OLED display 210 includes a mirrored back panel 211, an OLED panel 212, a QWP 214, and an electrochromic (EC) filter 216. OLED panel 212 represents the array of pixel elements which compose the image displayed on OLED display 210. An example of OLED panel 212 includes a passive-matrix OLED (PMOLED) panel, an active-matrix OLED (AMOLED) panel, or another type of OLED panel, as needed or desired. OLED display 210 has a variable viewing angle. In particular, while OLED display 210 emits equal amounts of light in each direction, EC filter 216 operates in a first (open) mode as a transparent polarizing element, providing a wide viewing angle, and operates in a second (private) mode as a view-restricting polarizing element to restrict the viewing angle. Thus OLED display 210 has a practical viewing angle of up to +/−85 degrees in the open mode and of as low as +/−30-45 degrees in the private mode. It will be understood that OLED display 210 may include one or more additional layers, coatings, deposits, films, or the like, between OLED panel 212, retarder/polarizer 214, and EC filter 216, and on the surface of the EC filter, as needed or desired.

Privacy controller 220 represents a hardware circuit configured to selectably operate EC filter 216 in either the open mode or the private mode, as needed or desired. For example, privacy controller 220 may represent a switchable voltage to EC filter 216, such that, when the voltage is not provided to the EC filter, the EC filter is in the open mode, permitting viewing of OLED display 210 in wide viewing angle, and when the voltage is provided to the EC filter, the EC filter is in the private mode, permitting viewing of the OLED display in the narrower viewing angle. In another example, privacy controller 220 may represent a variable voltage to EC filter 216, such that the greater the supplied voltage, the narrower the viewing angle on OLED display 210. Privacy controller 220 operates to receive an input to control the viewing angle of OLED display 210. For example, information handling system 100 may include a BIOS/UEFI option for setting EC filter 216 into one of the open mode or the private mode, or in a selectable degree of privacy. In another example, information handling system 100 may include a user interface that permits a user of the information handling system to select the operating mode of EC filter 216, as needed or desired.

Figure 3:
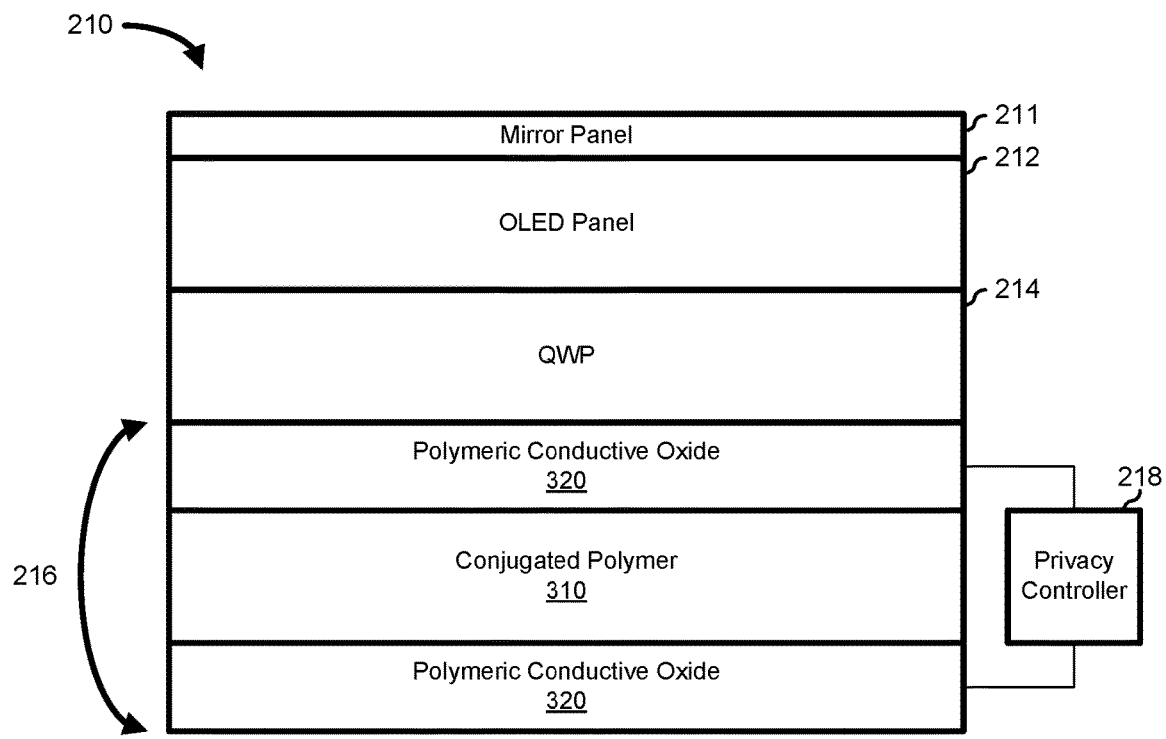
FIG. 3 is a diagram of an electroconductive (EC) filter on the OLED display of FIG. 2.
Figure 3:
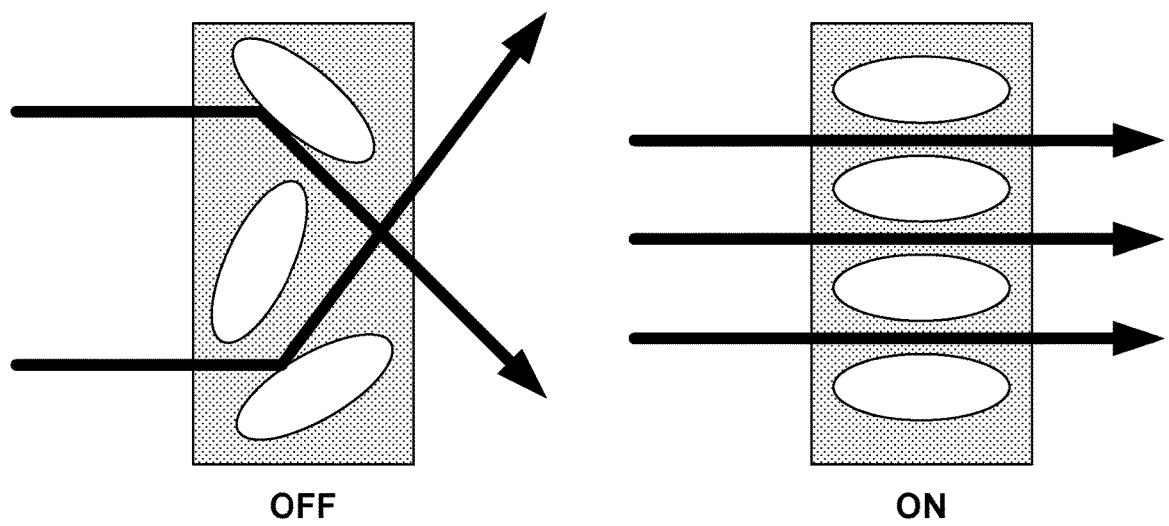

FIG. 3 illustrates OLED display 210, including OLED panel 212, QWP 214 and EC filter 216, and particularly shows an expanded view of the EC filter. Here, EC filter 216 includes a polymer layer 310 sandwiched between a top and bottom oxide layer 320. Polymer layer 310 provides a polarizing electrochromic effect. In particular, when no voltage is supplied by privacy controller 218 across oxide layers 320, and EC filter 216 is in the open mode, crystals formed in polymer layer 310 are not aligned, and the light emitted from OLED panel 212 is randomly reflected off of the crystals, allowing a wide viewing angle. On the other hand, when a voltage is supplied across oxide layers 320, and EC filter 216 is in the privacy mode, the crystals formed in polymer layer 310 are aligned, and the light emitted from OLED panel 212 is highly columnated, providing a restricted viewing angle. In a particular embodiment, polymer layer 310 represents a patterned stretch-aligned thin film of organic electrochromic material, such as polyaniline (e.g., $(C_6H_4NH)_n$) or another transparent electrochromic polymer, as needed or desired. In a particular embodiment, polymer layer 310 represents a bistable electrochromic polymer, being either fully off or fully on based upon the applied voltage being above or below a threshold. In another embodiment, polymer layer 310 provides a varying degree of alignment of the crystals formed in the polymer layer based upon the applied voltage. Polymer layer 310 is a thin-film layer, having a typical thickness of 50-100 nanometers (nm). Oxide layers 320 represent thin (typically 20-100 nm) transparent oxide layers composed of, for example, zinc oxide, indium-tin oxide (ITO), or the like, as needed or desired. In an alternate embodiment, oxide layers 310 may represent layers of other transparent conducting compounds, such as conductive polymers, metal grids and random metallic networks, carbon nanotubes (CNT), graphene, nanowire meshes, ultra-thin metal films, or the like. In a particular embodiment, where EC filter 216 may darken the image from OLED display 210 in either the open mode or the privacy mode, privacy controller 218 operates to direct the OLED display to increase the brightness of the image to compensate for the darkened image.

In a particular embodiment, an information handling system that represents a transparent OLED display, where the image is viewable from a "front" side and a "back" side of the OLED display, and ambient light from the front or back sides pass through the OLED display. Here, the OLED display will be understood to not include a mirror panel, but will emit light in both the front and back directions. Further, the OLED display may be understood to not include a QWP, as needed or desired, as image reflection is less of an issue in transparent OLED displays. However, an EC filter may be understood to be placed on the front surface of the OLED display, on the back surface, or on both the front and back surfaces. Where an EC filter is placed on both the front and back surfaces of the OLED display, each EC filter may be controlled by a single privacy controller, providing a common viewing mode on both the front and back sides of the OLED display, or each EC filter may be controlled by a separate privacy controller, providing potentially different viewing modes on the front and back sides of the OLED display.

Figure 4:
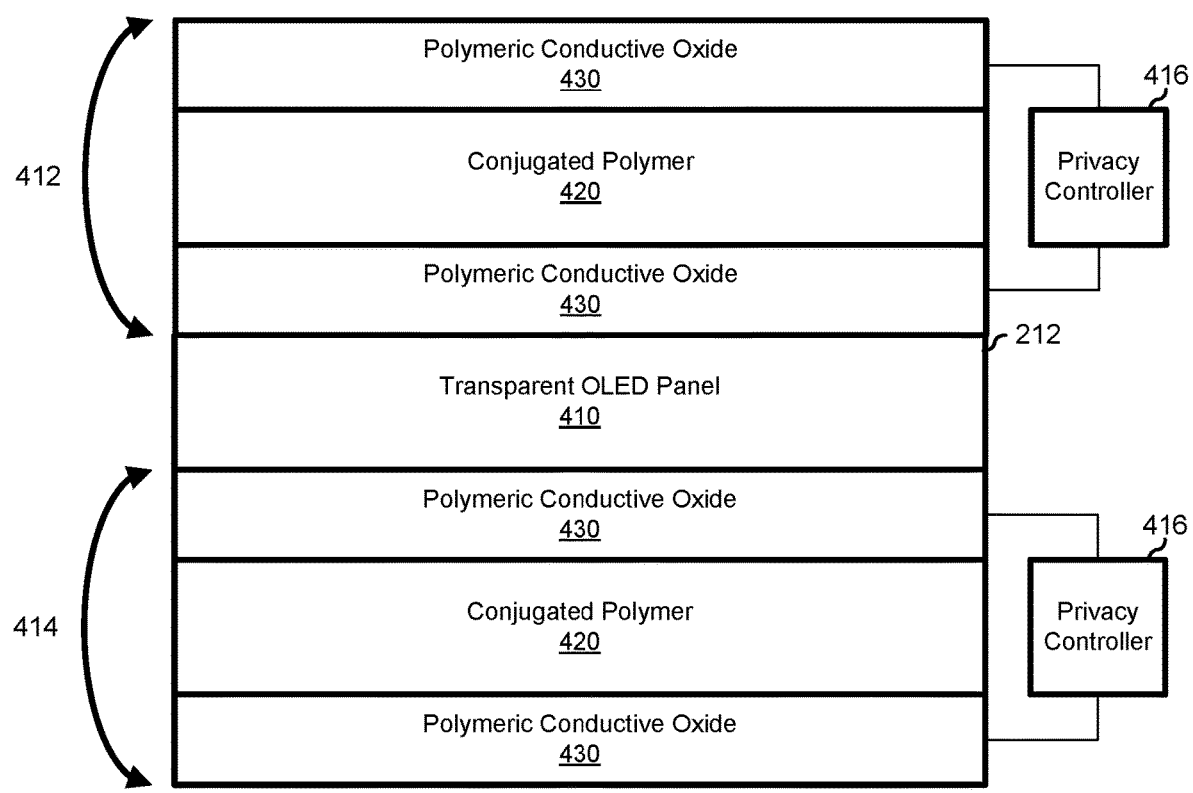
FIG. 4 is a block diagram of a transparent OLED display according to an embodiment of the current disclosure.
Figure 5:
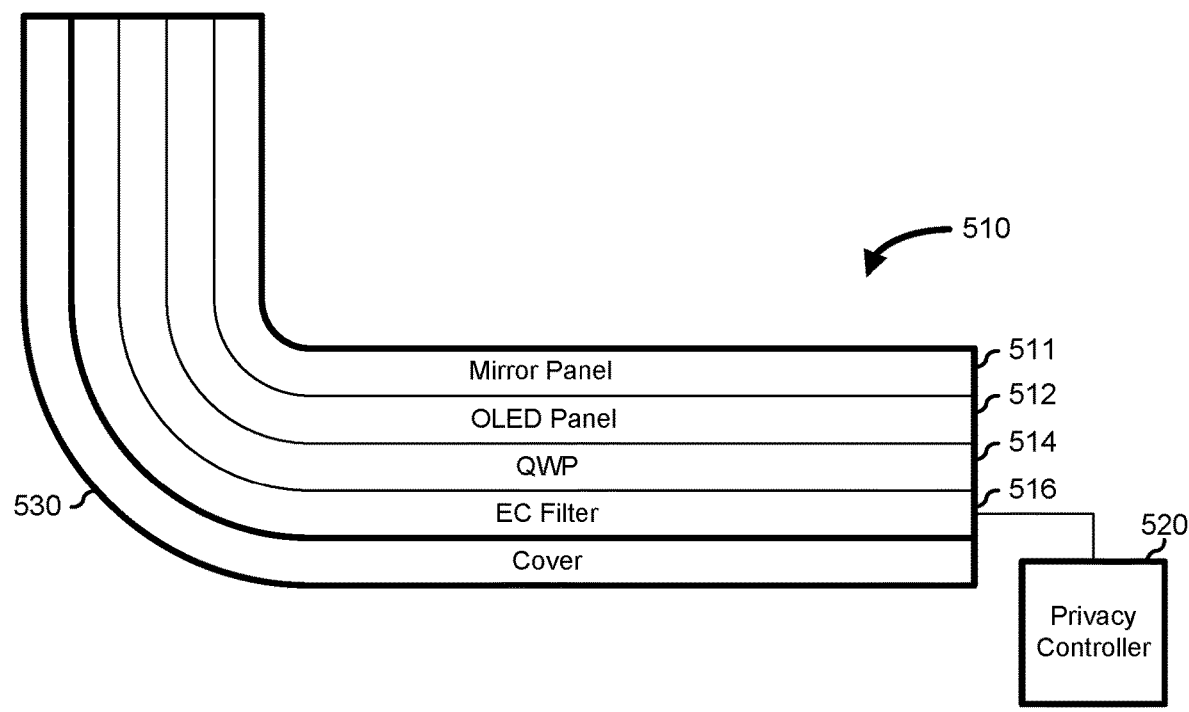
FIG. 5 is a diagram of an OLED display according to another embodiment of the current disclosure.

FIG. 4 illustrates an embodiment of a transparent OLED display 400 including a transparent OLED panel 410, an EC filter 412 on a back side of the transparent OLED display, an EC filter 414 on a front side of the transparent OLED display, a privacy controller 416 associated with the back side EC filter, and a privacy controller 418 associated with the front side EC controller.

FIG. 4 illustrates an OLED display 510 and a privacy controller 520. OLED display 510 is similar to OLED display 210, including a mirrored back panel 511, an OLED panel 512, a QWP 514, and an EC filter 516, and is controlled by privacy controller 520 similarly to privacy controller 220. OLED display 510 is covered by a protective cover 530. Protective cover 530 represents a structural polymer that is provided to give a rugged, shock- and scratch-proof surface to protect OLED display 510 from inadvertent damage during shipping and use of the OLED display. An example of a structural polymer may include a polymethyl methacrylate (PMMA), an optical borosilicate crown (BK-7) glass, a cyclo-olefin polymer (COP) such as Zeonex, a polycarbonate glass, a polyethylene terephthalate (PET) material, or the like. An exemplary protective cover 530 may have a refractive index from 1.2-1.7, and my preferably have a refractive index in a range from 1.3-1.6. OLED panel 510 is illustrated as having a 90 degree bend, and protective cover 530 is in conformal contact with the OLED panel. OLED panel 512 may typically have a bend at an acute angle of less than 90 degrees.

Figure 6:
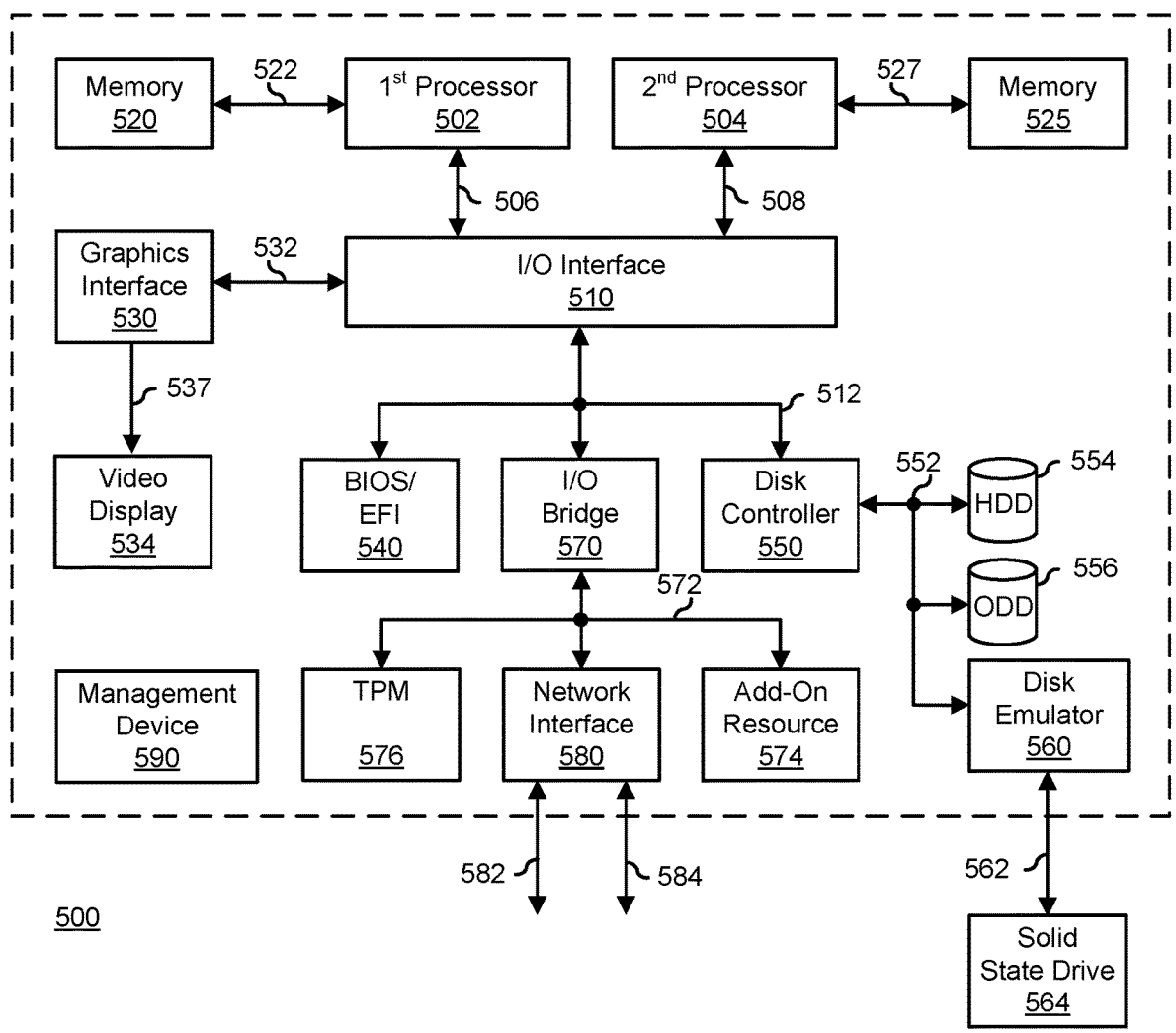
FIG. 6 is a block diagram illustrating a generalized information handling system according to another embodiment of the present disclosure.

FIG. 6 illustrates a generalized embodiment of an information handling system 600. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes a processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 636 to a video display 634. In a particular embodiment, information handling system 600 includes separate memories that are dedicated to each of processors 602 and 604 via separate memory interfaces. An example of memories 620 and 630 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 when the information handling system is otherwise shut down. An example of management device 690 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting diode (OLED) display, comprising:
    an OLED panel configured to provide an image; and
    an electroconductive (EC) filter configured to permit the image to be viewed within a first viewing angle in response to a first voltage applied to the EC filter, and to permit the image to be viewed exclusively within a second viewing angle in response to a second voltage applied to the EC filter, the first voltage being different from the second voltage, and the first viewing angle being greater than the second viewing angle.

2. The OLED display of claim 1, further comprising a controller configured to apply the first and second voltages to the EC filter.

3. The OLED display of claim 2, wherein:
    the controller is further configured to apply a third voltage to the EC filter, the third voltage being between the first and second voltages; and
    the EC filter is further configured to permit the image to be viewed exclusively within a third viewing angle in response to the third voltage, the third viewing angle being between the first and second viewing angles.

4. The OLED display of claim 2, wherein the first voltage is less than the second voltage.

5. The OLED display of claim 1, wherein the EC filter includes first and second transparent conductive oxide layers, and an electroconductive polymer layer sandwiched between the first and the second oxide layers.

6. The OLED display of claim 5, wherein the first and second oxide layers are formed of a thin film of one of a zinc oxide and an indium-tin oxide.

7. The OLED display of claim 5, wherein the polymer layer is formed of a polyalinine polymer.

8. The OLED display of claim 1, further comprising a mirrored panel.

9. The OLED display of claim 8, further comprising a quarter-wave plate sandwiched between the OLED panel and the EC filter.

10. The OLED display of claim 1, wherein the first viewing angle is greater than +/−85 degrees, and the second viewing angle is less than +/−45 degrees.

11. A method for providing a dynamic privacy screen on an organic light emitting diode (OLED) display, the method comprising:
    displaying, on an OLED panel of the OLED display, an image;
    permitting, by an electroconductive (EC) filter of the OLED display, the image to be viewed within a first viewing angle in response to a first voltage applied to the EC filter; and
    permitting, by the EC filter, the image to be viewed exclusively within a second viewing angle in response to a second voltage applied to the EC filter, the first voltage being different from the first voltage, and the first viewing angle being greater than the second viewing angle.

12. The method display of claim 11, further comprising applying, by a controller of the OLED display, the first and second voltages to the EC filter.

13. The method of claim 12, further comprising:
applying, by the controller, a third voltage to the EC filter, the third voltage being between the first and second voltages; and
permitting, by the EC filter, the image to be viewed exclusively within a third viewing angle in response to the third voltage, the third viewing angle being between the first and second viewing angles.

14. The method display of claim 12, wherein the first voltage is less than the second voltage.

15. The OLED method of claim 11, wherein the EC filter includes first and second transparent conductive oxide layers, and an electroconductive polymer layer sandwiched between the first and the second oxide layers.

16. The method of claim 15, wherein the first and second oxide layers are formed of a thin film of one of a zinc oxide and an indium-tin oxide.

17. The method of claim 15, wherein the polymer layer is formed of a polyalinine polymer.

18. The method of claim 11, wherein the OLED panel further includes a mirrored panel.

19. The method of claim 18, wherein the OLED panel further includes a quarter-wave plate sandwiched between the OLED panel and the EC filter.

20. An Organic Light Emitting Diode (OLED) display, comprising:
a transparent OLED panel configured to provide an image in a first direction and in a second direction, the first direction being opposite to the second direction;
a first electroconductive (EC) filter configured to permit the image to be viewed in the first direction within a first viewing angle in response to a first voltage applied to the first EC filter, and to permit the image to be viewed in the first direction exclusively within a second viewing angle in response to a second voltage applied to the first EC filter, the first voltage being different from the first voltage, and the first viewing angle being greater than the second viewing angle; and
a second electroconductive (EC) filter configured to permit the image to be viewed in the second direction within a third viewing angle in response to a third voltage applied to the second EC filter, and to permit the image to be viewed in the second direction exclusively within a fourth viewing angle in response to a fourth voltage applied to the second EC filter, the third voltage being different from the fourth voltage, and the third viewing angle being greater than the fourth viewing angle.

\* \* \* \* \*